United States Patent [19]

Suwa et al.

[11] Patent Number: 4,931,830
[45] Date of Patent: Jun. 5, 1990

[54] PROJECTION EXPOSURE APPARATUS

[75] Inventors: Kyoichi Suwa, Yokohama; Kazuo Ushida, Tokyo; Takeshi Suto, Funabashi; Masaomi Kameyama, Tokyo; Shigeru Hirukawa, Kashiwa; Shinichi Nakamura, Kawaguchi, all of Japan

[73] Assignee: Nikon Corporation, Tokyo, Japan

[21] Appl. No.: 389,978

[22] Filed: Aug. 7, 1989

[30] Foreign Application Priority Data

Aug. 12, 1988 [JP] Japan .............................. 63-201078

[51] Int. Cl.$^5$ ............................................. G03B 27/72
[52] U.S. Cl. ........................................ 355/71; 355/53
[58] Field of Search ............................ 355/53, 71, 67

[56] References Cited

U.S. PATENT DOCUMENTS 4,589,769  5/1986  Matsuki ................................. 355/71
4,780,747 10/1988  Suzuki et al. ......................... 355/53
4,853,756  8/1989  Matsuki ................................. 355/71

Primary Examiner—Monroe H. Hayes
Attorney, Agent, or Firm—Shapiro and Shapiro

[57] ABSTRACT

A projection exposure apparatus is provided with an illuminating optical system for illuminating a reticle having a predetermined fine pattern, a projection optical system for projecting the pattern of the reticle onto a wafer, and diaphragm means so constructed as to vary the aperture of a diaphragm of the projection optical system, wherein means for receiving information on the pattern present on the reticle, and means for determining a diaphgram aperture capable of eliminating the high-order diffracted light generated by the pattern of the reticle according to information as stated above and controlling the aperture of variable diaphragm means of the projection optical system, are provided.

19 Claims, 7 Drawing Sheets $y = \sin C^2 \frac{n\pi}{2}$

PROJECTION EXPOSURE APPARATUS

BACKGROUND OF THE INVENTION

1. Field of the Invention

The present invention relates to a projection exposure apparatus, and more particularly to an exposure apparatus in which the diaphragm aperture of a projection optical system is variable.

2. Related Background Art

Reduction projection exposure apparatus are widely used in the manufacture of semiconductor devices of ultrafine patterns, such as LSI or VLSI, and various efforts are being made to achieve transfer of still finer patterns. For coping with such dimensional reduction of the patterns, in addition to the use of exposure light of shorter wavelength, there has been tried an increase in the numerical aperture (N.A.) of the projection optical system, and there has been realized a projection optical system with a numerical aperture exceeding 0.5.

In the actual projection exposure utilizing a projection optical system with such large N.A., it is important to optimize the illuminating conditions. In this connection it is already known, as disclosed in the Japanese Laid-open Utility Model Sho 61-151, to obtain a suitable balance of the resolution and contrast for a predetermined pattern, by the adjustment of so-called $\sigma$-value which is the ratio of the N.A. of the illuminating optical system to that of the projection optical system. In the exposure of fine patterns, it is generally known that a larger N.A. of the projection optical system improves the limit resolution but reduces the depth of focus, while a smaller N.S. deteriorates the limit resolution but increases the depth of focus. In the use of a large N.A. which reduces the depth of focus, the focusing condition has to be extremely strict in the exposure of the fine patterns of the reticle into the wafer, and the pattern transfer cannot be made exactly even by a small change in the focus. For this reason it has been proposed to suitably vary the N.A. of the projection optical system.

However, in the conventional apparatus as explained above, the optimum numerical aperture of the projection optical system has to be determined empirically or experimentally for example by test exposures or other experimental for the fine patterns to be projected, the change in N.A. requires considerable labor and time which are unnegligible in the manufacture when various exposure patterns are projected in succession.

SUMMARY OF THE INVENTION

In consideration of the foregoing, the object of the present invention is to provide a projection exposure apparatus capable of eliminating the drawbacks of the conventional apparatus and easily determining the adequate N.A. of the projection optical system for a predetermined pattern, thereby easily realizing the optimum projection exposure condition and promptly and exactly achieving the transfer of the pattern ever becoming finer in dimension.

· The exposure apparatus of the present invention is provided with an illuminating optical system for illuminating a reticle having a predetermined fine pattern; a projection optical system for projecting the pattern of said reticle onto a wafer; and diaphragm means so constructed as to vary the aperture of a diaphragm of said projection optical system, wherein the diaphragm aperture of said projection optical system is so varied as to eliminate, among the diffracted light generated by the fine pattern present on the reticle, a portion of larger diffraction angles, namely high-order diffracted light not necessary for the formation of image of said pattern. More specifically the apparatus of the present invention is featured by the presence of means for receiving information on the pattern present on the reticle, and means for determining a diaphragm aperture capable of eliminating the high-order diffracted light generated by said pattern of the reticle according to said information and controlling the aperture of variable diaphragm means of said projection optical system.

In such structure, an adequate example of such information on the pattern is the information on the minimum line width of the pattern, and the diaphragm control means is preferably constructed in such a manner as to determine, based on the information on the minimum line width of the pattern, the diaphragm aperture corresponding to the diffraction angle of the second-or higher-order diffracted light of the illuminating light supplied from the illuminating optical system, and to control the diaphragm means at an aperture smaller than said determined diaphragm aperture. It is further preferable that said diaphragm control means control the aperture of the diaphragm means at a value substantially equal to an aperture corresponding to the sum of the angle of the first-order diffracted light generated in the minimum pattern and the angle of illuminating light from the illuminating optical system to the reticle.

The present invention of the above-explained structure allows to easily determine an adequate numerical aperture of the projection optical system for the smallest pattern present on the reticle, thereby selecting optimum projection exposure condition. Consequently there is provided a projection exposure apparatus capable of rapid and exact transfer of the patterns ever decreasing in size, and there is expected significant contribution to the manufacture of semiconductor devices of high integration, such as VLSI.

Other objects of the present invention, and the features and advantages thereof, will become fully apparent from the following detailed description, which is to be taken in conjunction with the attached drawings.

DESCRIPTION OF THE PREFERRED EMBODIMENTS

Now the present invention will be clarified in detail by embodiments thereof shown in the attached drawings.

Figure 1:
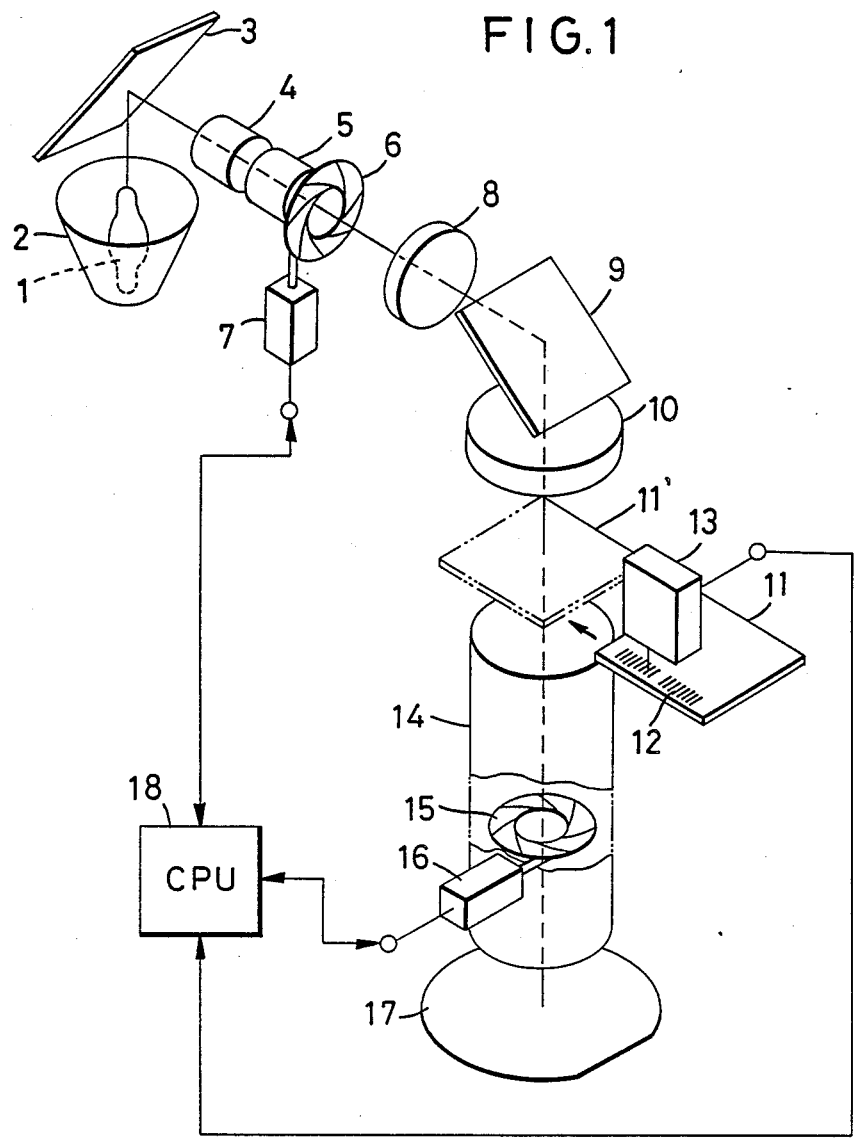
FIG. 1 is a perspective view schematically showing the structure of an embodiment of the present invention.

FIG. 1 is a perspective view schematically showing the structure of an embodiment of the projection exposure apparatus of the present invention. Light of a short wavelength emitted from an ultrahigh pressure mercury lamp 1 is reflected by an elliptic mirror 2, then by a cold mirror 3 and converges on a second focal point of said elliptic mirror. It is then guided through a condensing optical system 4 composed for example of a collimating lens and a cone prism for correcting the intensity distribution, and forms, by means of an optical integrator 5 such as a fly's eye lens, a substantially planer light source at a variable diaphragm 6 of the illuminating system. The light from the substantially planar light source at the variable diaphragm 6 is guided through a relay lens 8, a mirror 9 and a condenser lens 10 and substantially uniformly illuminates a reticle 11 moved to a chain-lined position 11′.

An unrepresented pattern formed on the reticle 11 is projected onto a wafer 17 with a predetermined image magnification by means of a projection objective lens 14, whereby photoresist present on the wafer 17 is exposed and subsequently treated chemically to achieve the transfer of a pattern, corresponding to the reticle pattern, onto the wafer. In the projection objective lens 14, there is provided a diaphragm 15 with variable aperture, and a diaphragm actuator 16 for controlling said aperture is provided in the vicinity of the lens tube of the objective lens. The diaphragm actuator 16 is provided therein with a position detector such as a linear encoder and is adapted to generate information corresponding to the diaphragm aperture. The diaphragm 6 in the illuminating optical system and the diaphragm 15 in the projection objective lens 14 are in mutually conjugate positions, and the ratio of the aperture of the image of the diaphragm 6 on said diaphragm 15 to the aperture of said diaphragm 15 corresponds to the $\sigma$-value.

The reticle 11 is moved to a position 11′ by means of an unrepresented reticle moving mechanism. A bar code reader 13 for receiving the information on the minimum pattern is provided alongside said moving mechanism, and reads a bar code 12 formed in a predetermined peripheral portion of the reticle 11 during the movement thereof. Said bar code 12 contains, in addition to the control number etc. of the reticle, information on the minimum line width of the pattern formed on said reticle 11, for example 0.7 μm (on the wafer), and the bar code reader 13 reads the information on the minimum line width of the pattern of the reticle 11 used for exposure. The minimum line width information from the bar code reader 13 is supplied to a CPU 18, which determines the diffraction angle $\theta_1$ of the first-order diffraction light of said pattern, based on said information from the bar code reader 13, for example indicating a minimum line width of 0.7 μm, and also receives the information on the incident angle $\theta_0$ of the illuminating light on the reticle 11, corresponding to the numerical aperture of the illuminating optical system, from a diaphragm actuator 7 for varying the aperture of the variable diaphragm 6 of the illuminating optical system. Then said CPU 18 determines the aperture corresponding, at the diaphragm 15 of the projection optical system 14, to the sum $(\theta_1+\theta_0)$ of the diffraction angle $\theta_1$ of the first-order diffracted light and the incident angle $\theta_0$ of the illuminating light, or, more exactly corresponding to $(\sin\theta_1+\sin\theta_0)$, and sends a signal to the diaphragm actuator 16 thereby setting the diaphragm 15 at thus determined aperture.

The above-explained embodiment, shown in FIG. 1, eliminates the high-order diffracted light generated by the fine pattern on the reticle, and executes the transfer of said fine pattern only with the low-order diffracted light, so that the depth of focus can be maintained relatively large.

In the following there will be explained the function of the above-explained embodiment.

The high-order diffracted light generated by the pattern on the reticle 11 has a larger diffraction angle, compared with that of the low-order diffracted light, and enters, therefore, the wafer with a larger incident angle. Consequently the extent of image blur caused by aberration of the wafer 17 from the focal position is larger in the high-order diffracted light than in the low-order diffracted light. Thus, in a focused state, the image sharpness is improved by the contribution of the high-order diffracted light, but, in an out-of-focus state, the image sharpness is rapidly deteriorated by the presence of said high-order diffracted light, so that the depth of focus becomes smaller in practice. In the exposure step in the usual projection exposure apparatus, the photoresist coated on the wafer has a $\gamma$-value, indicating the photosensitive characteristics, equal to or larger than 1.5, so that a sufficient resolution can be obtained with the low-order diffracted light only.

Thus, because the high-order diffracted light generated by the fine pattern of the reticle enters the peripheral portion of the incident pupil (image of the diaphragm 15 seen from the reticle side) of the projection optical system 14, it is possible to increase the practical depth of focus while maintaining the practically sufficient resolution by selecting the aperture of the diaphragm in such a manner as to intercept the high-order diffracted light and to transmit the low-order diffracted light only thereby improving the projection of fine pattern. Thus, the 0-th and 1st-order diffracted light of the illuminating light corresponding to the numerical aperture of the illuminating optical system can all be made to contribute to the image formation on the wafer, by adjusting the aperture of the diaphragm 15 of the projection optical system 14 at a value corresponding the sum of the numerical aperture of the illuminating optical system and the sine of angle of the 1st-order diffracted light.

In the following there will be given an additional explanation on the diffracted light. The reticle pattern used for the manufacture of semiconductor devices can be generally regarded as a 1:1 line-and-space pattern in which the width of lines is equal to that of the spaces therebetween. The diffraction angle $\theta$ of an n-th order diffracted light from such reticle pattern satisfied a relation:

$$\sin \theta = n \lambda / 2 d \quad (1)$$

wherein λ is the wavelength of the illuminating light, d is the width of a line or a space, and n is the order of diffraction wherein n=1, 3, 5, . . . In other periodic patterns, the above-mentioned equation still holds, using the pitch p of the pattern instead of 2d, and the diffracted light is also generated at n=2, 4, 6, . . .

Figure 2:
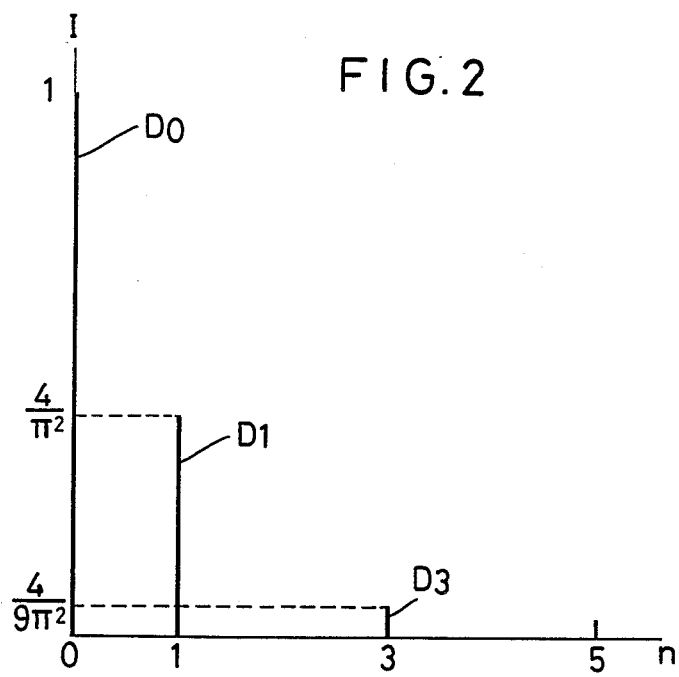
FIG. 2 is a chart showing the intensity distribution of from an ideal 1:1 line-and-space pattern on the reticle.

In case of an ideal 1:1 line-and-space pattern, there are only generated odd-order diffractions, with an intensity distribution as shown in FIG. 2, and no even-order diffractions occur. Also as shown in FIG. 2, the 0-th and 1st order diffracted lights are predominant, having much higher intensity. In case of actual 1:1 line-and-space pattern, the obtained intensity distribution is not so clear as shown in FIG. 2 because of the finite number of patterns, and weak diffractions are generated between the above-mentioned diffraction angles. However, since the intensity of such diffractions is extremely small in comparison with that of the 0-th and 1st order diffractions, the practical amount of light is sufficient even when the second- or higher-order diffracted light is cut off as in the foregoing embodiment.

The aforementioned incident angle $\theta_0$ of the illuminating light is related with the numerical aperture NAs, determined by the aperture of the diaphragm 6, of the illuminating optical system by:

$$NAs = \sin \theta_0 \quad (2).$$

Also from the equation (1), the 1st order diffraction angle $\theta_{01}$ of the light entering the reticle with an angle $\theta_0$ is determined by:

$$\sin \theta_{01} = \sin \theta_0 + \frac{\lambda}{2d}. \quad (3)$$

Assuming that the light perpendicularly entering the reticle 11 has a 1st order diffraction angle $\theta_1$, there is obtained, from the equation (1):

$$\sin \theta_{01} = \sin \theta_0 + \sin \theta_1 \quad (4).$$

Also there is obtained, from the equation (2):

$$\sin \theta_{01} = NAs + \frac{\lambda}{2d}$$

Thus, all the 1st-order diffracted light can be made to contribute to the image formation by selecting the numerical aperture $NA_0$ of the object side of the projection objective lens as:

$$NA_0 = \sin \theta_{01}.$$

Consequently the aperture of the diaphragm of the projection objective lens is to be controlled so as to satisfy an equation:

$$NA_0 = NAs + \frac{\lambda}{2d}. \quad (5)$$

Consequently, before the reticle 11 is brought to the position for projection exposure, the diaphragm 15 of the projection objective lens is adjusted to an optimum aperture for the minimum line width on said reticle, whereby the fine pattern can be clearly transferred onto the wafer with a relatively large depth of focus.

For an isolated pattern such as an isolated line or an isolated rectangular hole, the diffracted light intensity I in the direction of diffraction angle $\theta$ is represented by:

$$I = k \left\{ d \, \text{sinc} \, \frac{d\pi \sin \theta}{\lambda} \right\}^2 \quad (6)$$

wherein d: pattern width

λ: wavelength of light k: constant $$\text{sinc} \, x = \frac{\sin x}{x}$$

Figure 3:
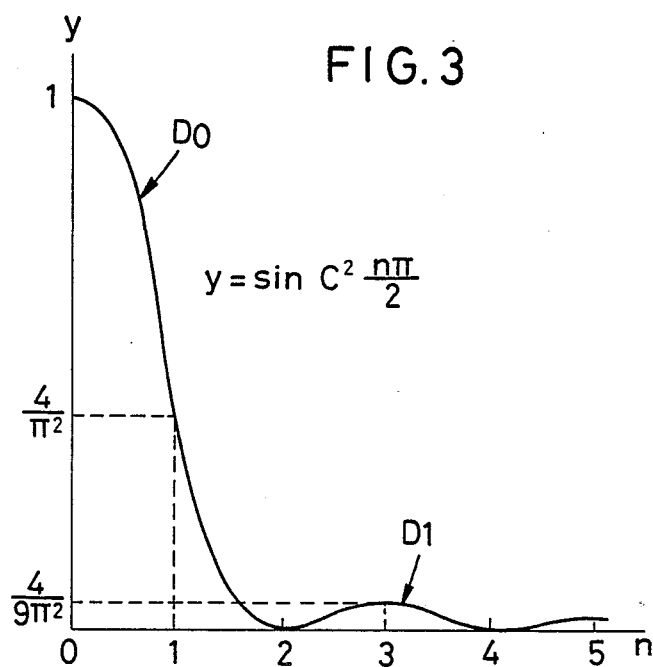
FIG. 3 is a chart showing the intensity distribution of diffracted light from an isolated pattern on the reticle.

With the order of diffraction of the equation (1) for the 1:1 line-and-space pattern, the equation (6) can be rewritten as:

$$I = k \left\{ d \, \text{sinc} \, \frac{n\pi}{2} \right\}^2 \quad (7)$$

corresponding to an intensity distribution shown in FIG. 3. Stated differently, the isolated pattern generates diffracted light in relatively wide angular ranges corresponding to a range from 0th to 2nd order, a range from 2nd to 4th order etc. in the diffraction of the aforementioned 1:1 line-and-space pattern. Also in case of such isolated pattern, the low-order diffracted light, corresponding to the 0-th to 1st order diffracted light in the 1:1 line-and-space pattern, is predominant, so that the practical amount of light is sufficient even if the 2nd- or higher-order diffracted light is cut off.

The distribution of the diffracted light of an isolated pattern is represented by a sinc function as shown in FIG. 3, and the 0-th order diffracted light $D_0$ and the 1st-order diffracted light $D_1$ in said intensity distribution respectively correspond to 0-th to 2nd order components and 2nd to 4th order components of the diffraction in case of the line-and-space pattern as shown in FIG. 2. Consequently the above-mentioned cut off may be described as applicable to the 1st- and higher-order component of the diffracted light, represented by the sinc- function, of the isolated pattern.

Figure 4A:
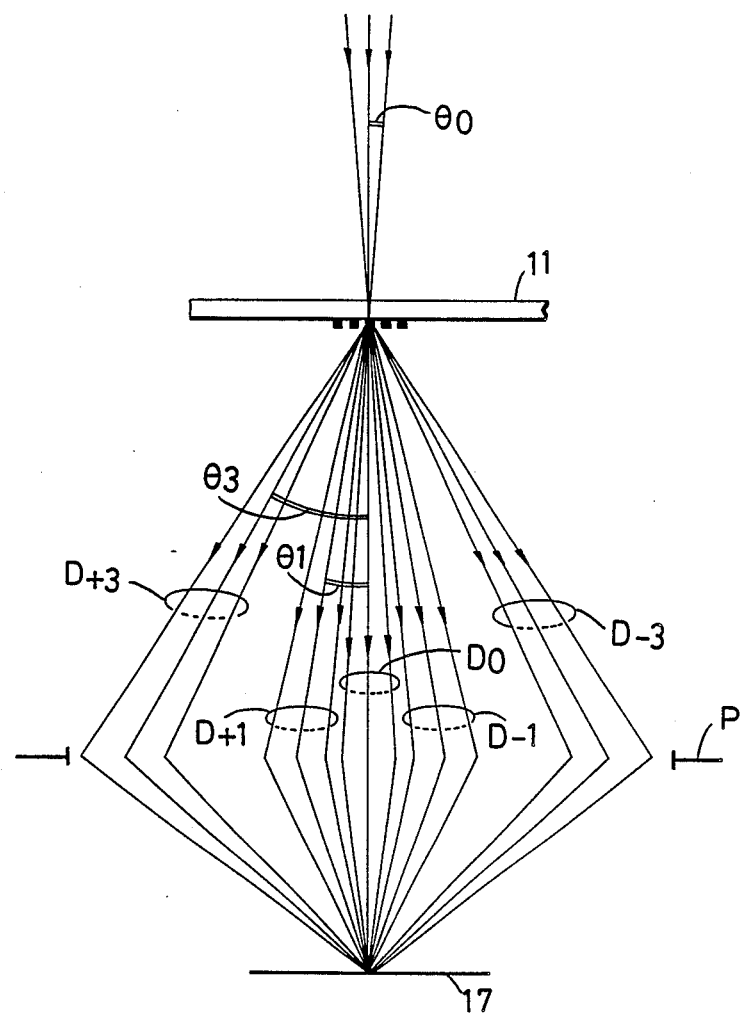
FIG. 4A is a schematic view showing the imaging light fluxes from an ideal 1:1 line-and-space pattern on the reticle, in which the variable diaphragm of the projection objective lens is not controlled.
Figure 4B:
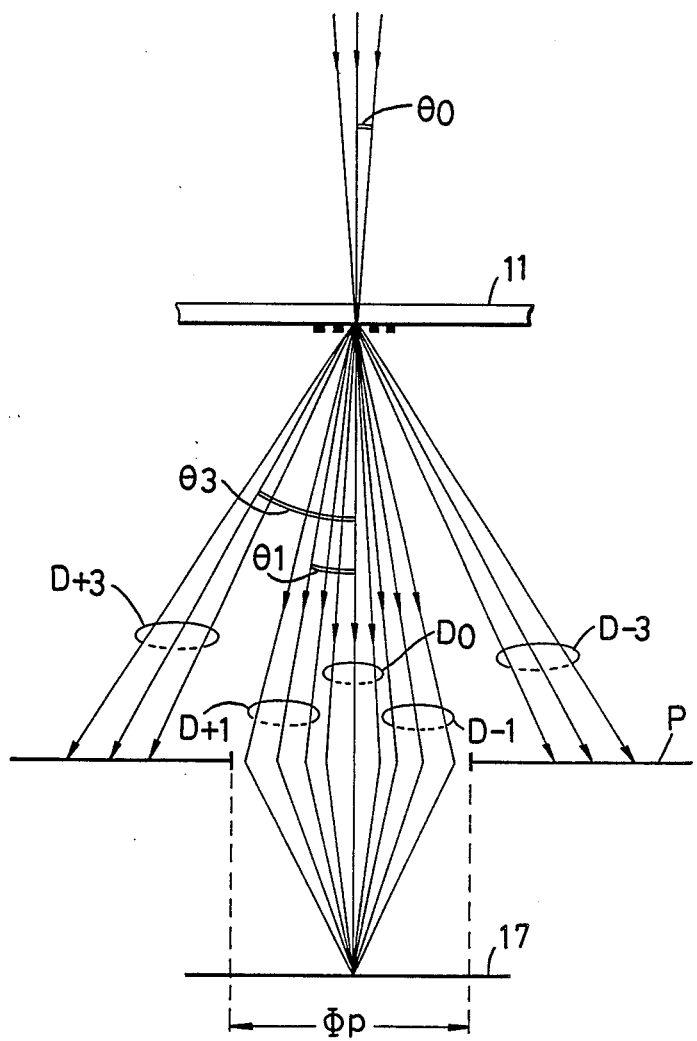
FIG. 4B is a schematic view showing the imaging light fluxes from an ideal 1:1 line-and-space pattern on the reticle, in which the variable diaphragm of the projection objective lens is controlled according to the present invention.

FIGS. 4A and 4B illustrate the state of imaging by the projection objective lens 14, wherein the finest pattern on the reticle 11 is a 1:1 line-and-space pattern. For the ease of understanding, it is assumed that the entrance pupil and the exit pupil of the projection objective lens 11 mutually coincide as a pupil P, and the magnification of pupil is unity.

As shown in FIGS. 4A and 4B, the 1:1 line-and-space pattern of the reticle 11, illuminated with an angle $\theta_0$ by the illuminating optical system generates diffracted light beams which are concentrated on the wafer 17 by the converging action of the projection objective lens 14. The first-order diffracted light $D_{+1}$, $D_{-1}$ from the 1:1 line-and-space pattern of the reticle 11 reach the pupil P of the projection objective lens 14 with an angle $\theta_1$ of the central ray with respect to the optical axis, and are then concentrated on the wafer 17. The second-order diffracted light does not exist as shown in FIG. 3. The 3rd-order diffracted lights $D_{+3}$, $D_{-3}$ reach the pupil P of the projection objective lens 14 with an angle $\theta_3$ of the central ray with respect to the optical axis, and are then concentrated on the wafer 17.

FIG. 4B shows the state of imaging with diffracted light, as shown in FIG. 4A, wherein the aperture of the diaphragm 15 of the projection objective lens 14 is appropriately controlled by a structure as shown in FIG. 1. The 3rd-order diffracted lights $D_{+3}$, $D_{-3}$ are cut off by the diaphragm, so that the fine pattern on the wafer 17 is formed only by the 0-th order diffracted light $D_0$ and the first-order diffracted lights $D_{+1}$, $D_{-1}$. Said 0-th order diffracted light $D_0$ and 1st-order diffracted lights $D_{+1}$, $D_{-1}$ pass, on the pupil P, within the image of diaphragm of a diameter $\Phi_p$. Said diameter $\Phi_p$ corresponds to the numerical aperture $NA_0$ of the projection objective lens 14, and is related to the actual diameter $\Phi$ of the diaphragm 15 by $\Phi_p = \beta\Phi$, wherein $\beta$ is the magnification of the image of the incident pupil at the reticle side, with respect to the diaphragm 14.

As an example, if the smallest line width of the pattern on the reticle 11 is 8.0 μm, the exposing wavelength λ is 435.8 nm and the numerical aperture NAs of the illuminating optical system is 0.05, the numerical aperture of the projection objective lens 14 at the reticle side is calculated as 0.077 according to the equation (5).

Figure 5A:
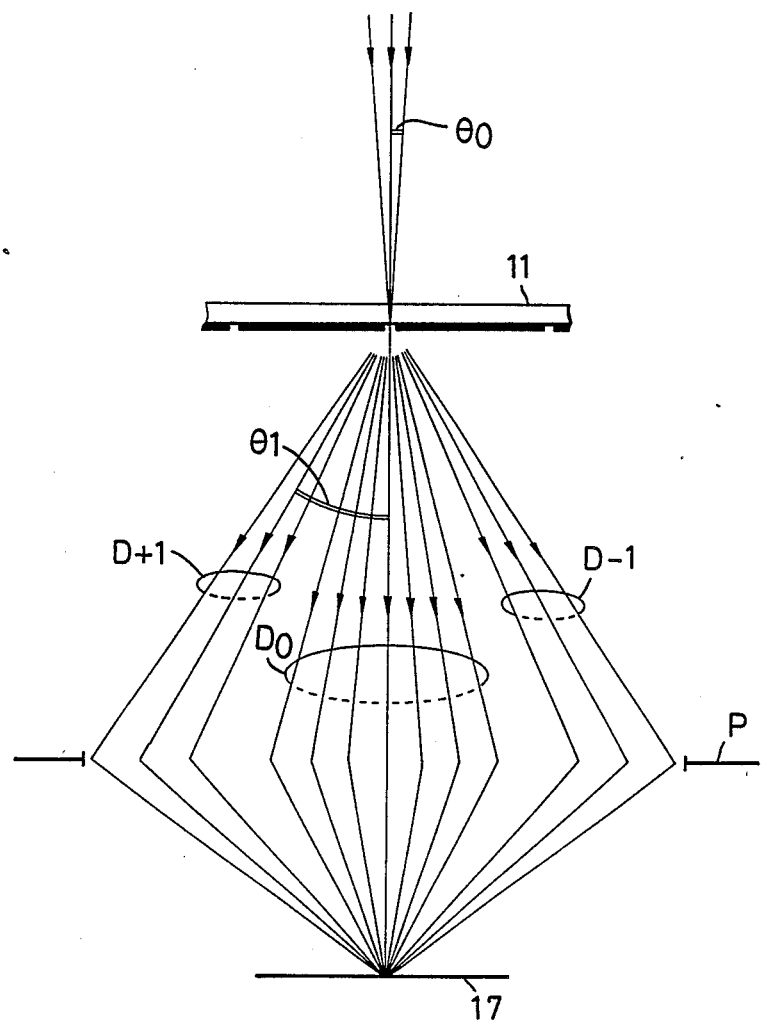
FIG. 5A is a schematic view showing the imaging light fluxes from an isolated pattern on the reticle, in which the variable diaphragm of the projection objective lens is not controlled.
Figure 5B:
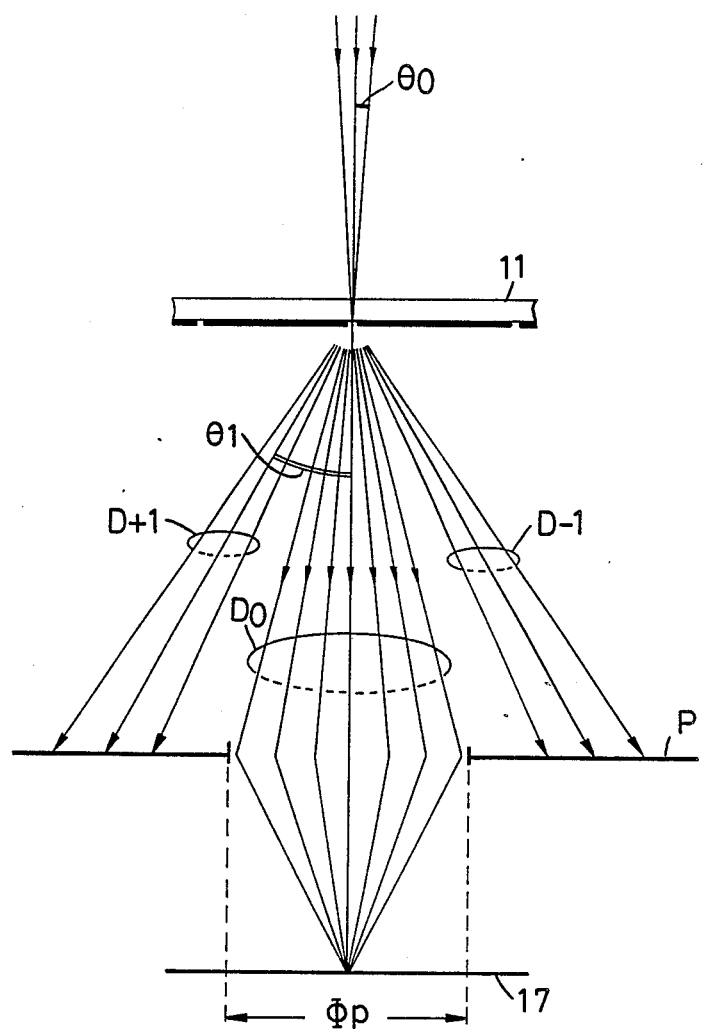
FIG. 5B is a schematic view showing the imaging light fluxes from an isolated pattern on the reticle, in which the variable diaphragm of the projection objective lens is controlled according to the present invention.

FIGS. 5A and 5B illustrate the state of imaging in case the smallest pattern on the reticle 11 is an isolated pattern composed of an isolated line. Also in this case, as shown in FIG. 5A, the isolated pattern illuminated by the illuminating optical system with an angle $\theta_0$ generates diffracted lights, which are concentrated on the wafer 17 by the converging action of the projection objective lens 14. The 0-th order diffracted light $D_0$ of the sinc function as shown in FIG. 3, from the isolated pattern of the reticle 11, reaches the pupil P of said lens 14, and is then concentrated onto the wafer 17. Also the 1st-order diffracted lights $D_{+1}$, $D_{-1}$ in the sinc function reach said pupil P with an angle $\theta_1$ of the central ray with respect to the optical aixs, and are concentrated onto the wafer 17. In this case of isolated pattern, the intensity of diffracted light can be regarded as zero for n=2 or 4 as shown in FIG. 3, but the diffracted light exists widely in other areas.

FIG. 5B shows the state of imaging with diffracted light, as shown in FIG. 5A, wherein the aperture of the diaphragm 15 of the projection objective lens 14 is suitably controlled. Since the first-order diffracted lights $D_{+1}$, $D_{-1}$ are cut off by the diaphragm, the 0-th order diffracted light $D_0$ alone contributes to the formation of fine pattern on the wafer 17. In FIG. 5B, the 0-th order diffracted light alone passes within the diameter $\Phi_p$ of the image of the diaphragm on the pupil P.

If the width of said isolated line is same as the line width of the aforementioned line-and-space pattern, and if the illuminating optical system is same as explained before, the appropriate numerical aperture of the projection objective lens is 0.077 as in the case of FIG. 4B. Also the loss in the amount of projecting light, resulting from such elimination of the higher-order diffracted light with the diaphragm, is negligibly small as explained before.

In the foregoing description relating to FIGS. 4A to 5B, it is assumed, for the purpose of simplicity, that the pattern generating the diffracted light is positioned on the optical axis, but the foregoing description is still applicable even when the fine pattern is present out of the optical axis since the intensity distribution of the diffracted light on the pupil plane P is almost same. In the foregoing embodiment, the aperture of the diaphragm 15 of the projection objective lens 14 is controlled substantially equal to an aperture corresponding to the sum of sin $\theta_1$ corresponding to the angle of the first-order diffracted light generated by the smallest pattern on the reticle 11 and sin $\theta_0$ corresponding to the incident angle of the illuminating light from the illuminating optical system to the reticle 11. However, in consideration of the intensity distribution of the diffracted light as shown in FIGS. 2 and 4A, it is also possible to determine the diffraction angle $\theta_3$ of the third-order diffracted light, instead of the diffraction angle $\theta_1$ of the first-order diffracted light, and to control the aperture of the diaphragm 15 slightly smaller than a diameter corresponding to said third-order diffraction angle $\theta_3$.

Also in the embodiment shown in FIG. 1, the aperture of the variable diaphragm 6 of the illuminating optical system can be varied by the diaphragm actuator 7. In such case, it is preferable to determine the numerical aperture of the illuminating optical system by the CPU 18 corresponding to the aperture of the diaphragm and to regulate the aperture of the diaphragm 15 of the projection objective lens 14 to an optimum value according to the equation (5).

In such the diaphragms 6, 15 can be so controlled that the ratio $\sigma$ of the numerical aperture NAs of the illuminating optical system at the reticle side to the numerical aperture NAo of the projection optical system at the object side is constant, or that $NAo = \lambda/2d(1-\sigma)$ and $NAs = \sigma \cdot NAo$ according to the equation (3).

In the present embodiment a bar code reader 13 is employed as the means for receiving the information on smallest pattern, but it is also possible to automatically detect the minimum pattern width by projecting a laser beam and detecting the diffracted light, or to manually enter the minimum line width of the pattern directly into the CPU 18.

It is furthermore possible, as disclosed in the U.S. Pat. No. 4,629,313, to provide a movable slit and a photoelectric sensor for detecting the transmitted light, on the wafer stage, and to measure the width of the image of reticle pattern formed on the stage by playing the reticle at the exposure position and illuminating said reticle in the same condition as in the exposure, thereby determining the minimum line width of the reticle pattern. It is furthermore possible to project a slit from the stage to the reticle, and to move the slit with respect to the reticle pattern through a beam splitter in the illuminating optical system, thereby photoelectrically detecting the width of the reticle pattern. It is furthermore possible, in the measurement of width of the reticle pattern by means of the stage slit, through the projection objective lens 14 itself, to suitably vary the diaphragm aperture of the projection objective lens 14, thereby determining the optimum aperture for the reticle pattern, and the CPU 18 may include means therefor.

Figure 6A:
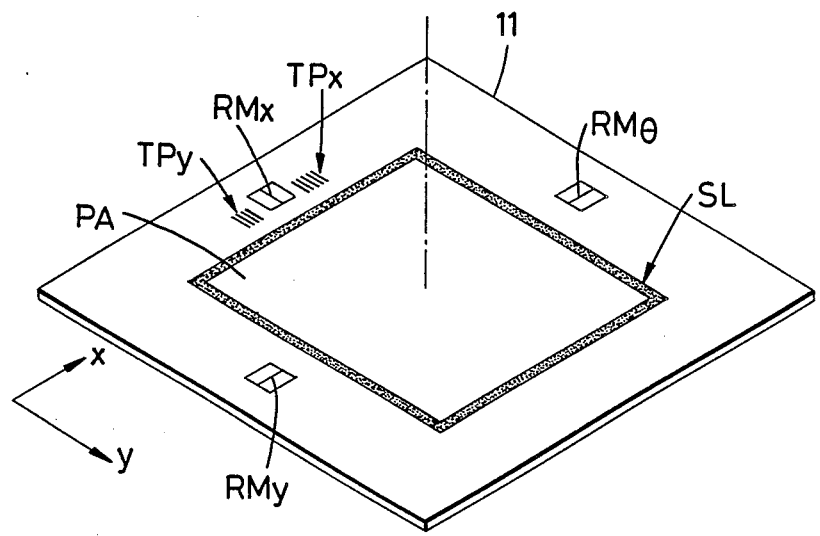
FIG. 6A perspective view schematically showing a reticle structure suitable for the measurement of line width of the reticle pattern.
Figure 6B:
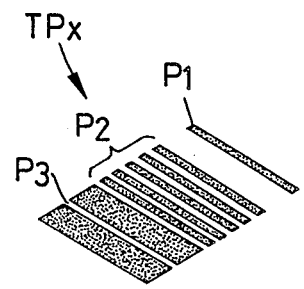
FIG. 6B is a magnified perspective view of a reference pattern formed on the reticle.

FIG. 6A is a schematic perspective view of a reticle suitable for the measurement of line width of the reticle pattern by means of a stage slit and through the projection objective lens 11 itself. A rectangular effective pattern area PA is surrounded by a light shield belt SL of a predetermined with, and alignment marks $RM_x$, $RM_y$, $RM\theta$ for the reticle 11 are provided in three positions outside the light shield belt SL. In the vicinity for example of the mark RMx there are provided reference patterns TPx, TPy of a width same as the minimum line width present in the pattern area PA. The reference pattern TPx is composed of a group linear patterns extended in the y-direction, while the reference pattern TPy is composed of a group of linear patterns extended in the x-direction. The reference pattern TPx, for example, is composed, as shown in FIG. 6B in magnified view, of a dark isolated line $P_1$, a 1:1 line-and-space pattern $P_2$, and a light isolated line $P_3$. The line width of such patterns can be directly measured by scanning the image, on the stage, of such reticle reference pattern with the stage slit. In such operation, it is preferable to open the aperture of an unrepresented reticle blind (field diaphragm) in the illuminating optical system beyond the light shield belt SL to illuminate also the reference patterns TPx, TPy. The above-explained structure allows to promptly and exactly determine the numerical aperture of the projection objective lens optimum for the reticle containing various patterns, since a representative pattern can be formed as the reference pattern.

The present invention is not limited to the projection exposure apparatus utilizing a mercury lamp as explained above, but is applicable also to a projection exposure apparatus utilizing a laser as the light source, and, in such case, there is provided an integrator or beam handling means for forming a substantially planar light source at the diaphragm in the illuminating optical system, thereby realizing partially coherent illumination as in the foregoing embodiments.

We claim:

1. A projection exposure apparatus for projecting a fine pattern formed on a reticle onto a wafer, comprising:
   an illuminating optical system for illuminating said reticle;
   a projection optical system for projecting the pattern of said reticle onto said wafer;
   variable diaphragm means provided in said projection optical system for varying the aperture thereof;
   means for providing pattern information on the dimension of the pattern of said reticle; and
   diaphragm control means for controlling the aperture of said variable diaphragm means, based on said pattern information, at an aperture capable of intercepting the diffracted light of a large diffraction angle among the diffracted light generated by said pattern illuminated by said illuminating optical system.

2. A projection exposure apparatus according to claim 1, wherein said diaphragm control means is adapted to determine the aperture of said variable diaphragm means at a value substantially equal to the aperture corresponding to the sum of the angle of the first-order diffracted light generated by the pattern of said reticle and the angle of the illuminating light beam from said illuminating optical system to said reticle.

3. A projection exposure apparatus according to claim 1, wherein said diaphragm control means is adapted to set the aperture of said variable diaphragm means so as to satisfy the following equation:

$$\sin \theta_{01} = \sin \theta_1 + \sin \theta_0$$

wherein $\theta_1$ is the angle of the first-order diffracted light generated by the pattern of said reticle, $\theta_0$ is the angle of the illuminating light beam entering said reticle, and $\theta_{01}$ is the angle of light beam corresponding to the numerical aperture of said projection optical system at the object side.

4. A projection exposure apparatus according to claim 1, wherein said pattern information is the information on the line width of said pattern, and said diaphragm control means is adapted to determine the aperture corresponding to the angle of the diffracted light exceeding a predetermined diffraction angle and to control said variable diaphragm means at an aperture smaller than the above-mentioned aperture, based on said pattern information and on the illuminating light supplied from said illuminating optical system.

5. A projection exposure apparatus according to claim 1, wherein said illuminating optical system comprises diaphragm means capable of varying the angle of the illuminating light beam entering said reticle, and said diaphragm control means is adapted to control the aperture of said variable diaphragm means of said projection optical system and said diaphragm means of said illuminating optical system.

6. A projection exposure apparatus according to claim 1, further comprising means for reading, from said reticle, the line width of the pattern of said reticle.

7. A projection exposure apparatus according to claim 6, wherein said pattern information is provided on said reticle, separately from said pattern.

8. A projection exposure apparatus for projecting a fine pattern formed on a reticle onto a wafer, comprising:
   an illuminating optical system for illuminating said reticle with the light of a predetermined wavelength;
   a projection optical system for projecting the pattern of said reticle onto said wafer;
   means for providing information on the minimum line width of the pattern on said reticle;
   variable diaphragm means provided in said projection optical system for varying the aperture thereof; and
   diaphragm control means for controlling the aperture of said variable diaphragm means, based on said information, at an aperture capable of intercepting the diffracted light of a diffraction angle larger than a predetermined diffraction angle, among the diffracted light generated by the pattern of said minimum line width illuminated by said illuminating optical system.

9. A projection exposure apparatus according to claim 8, wherein said diaphragm control means is adapted to control said variable diaphragm means so as to satisfy the following condition:

$$NA_0 = NA_s + \lambda/2d$$

wherein $\lambda$ is the wavelength of the light illuminating said reticle, d is the minimum line width of the pattern on said reticle, $NA_0$ is the numerical aperture of the projection optical system at the object side, and $NA_s$ is the numerical aperture of said illuminating optical system at the reticle side.

10. A projection exposure apparatus according to claim 8, wherein said information providing means comprises a line width measuring device capable of measuring a reference pattern provided on said reticle separately from said pattern and having a line width equal to said minimum line width of said pattern, and the line width of said reference pattern.

11. A projection exposure apparatus according to claim 8, wherein said illuminating optical system comprises diaphragm means capable of varying the angle of the illuminating light beam entering said reticle, and said diaphragm control means is adapted to control the aperture of said variable diaphragm means of said projection optical system and the aperture of said diaphragm means of said illuminating optical system.

12. A projection exposure apparatus according to claim 8, wherein said illuminating optical system comprises a variable diaphragm, and said diaphragm control means is adapted to control the variable diaphragm means of the projection optical system and the variable diaphragm of the illuminating optical system so as to satisfy the following conditions:

$$NA_0 = \lambda/2d(1 - \sigma) \text{ and}$$
$$NA_s = \sigma \cdot NA_0$$

wherein $\lambda$ is the wavelength of the light illuminating said reticle, d is the minimum line width of the pattern on said reticle, $NA_0$ is the numerical aperture of the projection optical system at the object side, $NA_s$ is the numerical aperture of the illuminating optical system at the reticle side, and $\sigma$ is a constant.

13. A projection exposure apparatus for projecting a fine pattern formed on a reticle onto a substrate, comprising:
   an illuminating optical system for illuminating said reticle;
   a projection optical system comprising a diaphragm with variable aperture and adapted to project the pattern of said reticle onto said substrate;
   means for providing information concerning said reticle; and
   means for regulating said diaphragm, based on said information, at an aperture necessary for intercepting the high-order diffracted light, among the diffracted light generated by the fine pattern of said reticle.

14. A projection exposure apparatus according to claim 13, wherein said regulating means comprises means for determining the aperture of said diaphragm based on said information, and diaphragm varying means for varying the aperture of the diaphragm of said projection optical system according to thus determined aperture.

15. A projection exposure apparatus according to claim 13, wherein said regulating means is adapted to regulate the aperture of said diaphragm so as to intercept the diffracted light except the low-order diffracted light at least including 0-th order and 1st-order diffracted light.

16. A projection exposure apparatus according to claim 13, wherein said information concerning the reticle is the information on the dimension of fine pattern on said reticle.

17. A projection exposure apparatus according to claim 16, wherein said information concerning the reticle is the information on the minimum dimension of fine pattern on said reticle.

18. A projection exposure apparatus according to claim 13, wherein said information concerning said reticle is provided on said reticle.

19. A projection exposure apparatus according to claim 18, further comprising means for reading said information concerning said reticle.

* * * * *